(12) United States Patent
Hsu et al.

(10) Patent No.: US 7,473,985 B2
(45) Date of Patent: Jan. 6, 2009

(54) HYBRID ORIENTED SUBSTRATES AND CRYSTAL IMPRINTING METHODS FOR FORMING SUCH HYBRID ORIENTED SUBSTRATES

(75) Inventors: Louis Lu-Chen Hsu, Fishkill, NY (US); Jack Allan Mandelman, Flat Rock, NC (US); William Robert Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 11/154,906

(22) Filed: Jun. 16, 2005

(65) Prior Publication Data

US 2006/0284250 A1   Dec. 21, 2006

(51) Int. Cl.
*H01L 29/04*  (2006.01)

(52) U.S. Cl. ............... 257/627; 257/347; 257/350; 257/351; 257/369; 257/628

(58) Field of Classification Search ........... 257/347, 257/350–351, 369, 627–628
See application file for complete search history.

(56) References Cited

U.S. PATENT DOCUMENTS

| | | | |
|---|---|---|---|
| 5,198,371 A | 3/1993 | Li | |
| 5,296,410 A * | 3/1994 | Yang | 438/696 |
| 5,366,923 A | 11/1994 | Beyer et al. | |
| 5,374,564 A | 12/1994 | Bruel | |
| 5,453,394 A | 9/1995 | Yonehara et al. | |
| 5,523,602 A | 6/1996 | Horiuchi et al. | |
| 5,734,564 A | 3/1998 | Brkovic | |
| 5,882,987 A | 3/1999 | Srikrishnan | |
| 6,815,278 B1 | 11/2004 | Ieong et al. | |
| 6,830,962 B1 | 12/2004 | Guarini et al. | |
| 6,972,478 B1 * | 12/2005 | Waite et al. | 257/627 |
| 6,998,684 B2 * | 2/2006 | Anderson et al. | 257/351 |
| 7,125,785 B2 * | 10/2006 | Cohen et al. | 438/481 |
| 2004/0256700 A1 | 12/2004 | Doris et al. | |
| 2005/0082531 A1 | 4/2005 | Rim | |
| 2006/0024931 A1 * | 2/2006 | Chan et al. | 438/528 |
| 2006/0073646 A1 * | 4/2006 | Yang | 438/152 |

(Continued)

OTHER PUBLICATIONS

Melanie J. Sherony et al., "Minimization of Threshold Voltage Variation in SOI MOSFETs," Proceedings 1994 IEEE International SOI Conference, Oct. 1994, pp. 131-132.

(Continued)

*Primary Examiner*—Zandra Smith
*Assistant Examiner*—Bac H Au
(74) *Attorney, Agent, or Firm*—Wood, Herron & Evans, LLP

(57) ABSTRACT

A semiconductor structure with an insulating layer on a silicon substrate, a plurality of electrically-isolated silicon-on-insulator (SOI) regions separated from the substrate by the insulating layer, and a plurality of electrically-isolated silicon bulk regions extending through the insulating layer to the substrate. Each of one number of the SOI regions is oriented with a first crystal orientation and each of another number of the SOI regions is oriented with a second crystal orientation that differs from the first crystal orientation. The bulk silicon regions are each oriented with a third crystal orientation. Damascene or imprinting methods of forming the SOI regions and bulk silicon regions are also provided.

15 Claims, 3 Drawing Sheets

U.S. PATENT DOCUMENTS

| | | |
|---|---|---|
| 2006/0113605 A1 | 6/2006 | Currie |
| 2006/0170045 A1* | 8/2006 | Yan et al. .................. 257/347 |
| 2006/0231893 A1 | 10/2006 | Bernstein et al. |
| 2007/0015346 A1 | 1/2007 | Cohen et al. |

OTHER PUBLICATIONS

J. A. Mandelman et al., "Floating-Body Concerns for SOI Dynamic Random Access Memory (DRAM)," Proceedings 1996 IEEE International SOI Conference, Oct. 1996, pp. 136-137.

R. Islam et al., "Wafer Level Packaging and 3D Interconnect for IC Technology," 2002 IEEE/SEMI Advanced Semiconductor Manufacturing Conference, pp. 212-217.

N. Sato et al., "Precise Thickness Control for Ultra-Thin SOI in ELTRAN® SOI-Epi™ Wafer," 2002 IEEE International SOI Conference, Oct. 2002, pp. 209-210.

A. Vandooren et al., "Scaling Assessment of Fully-Depleted SOI Technology at the 30nm Gate Length Generation," 2002 IEEE International SOI Conference, Oct. 2002, pp. 25-27.

P. Lindner et al., "3D Interconnect through Aligned Wafer Level Bonding," 2002 Electronic Components and Technology Conference, pp. 1439-1443.

M. Yang et al., "High Performance CMOS Fabricated on Hybrid Substrate With Different Crystal Orientations," 2003 IEEE, pp. 18.7.1-18.7.4.

M. Yang et al., "On the Integration of CMOS with Hybrid Crystal Orientations," 2004 Symposium on VLSI Technology Digest of Technical Papers, pp. 160-161.

Akiko Ohata et al., "Mobility Issues in Ultra-Thin SOI MOSFETs: Thickness Variations, GIFBE and Coupling Effects," 2004 IEEE, pp. 109-112.

Toshinori Numata, "Device Design for Subthreshold Slope and Threshold Voltage Control in Sub-100-nm Fully Depleted SOI MOSFETs," IEEE Transactions on Electron Devices, vol. 51, No. 12, Dec. 2004, pp. 2161-2167.

Sixto Ortiz Jr., http://www.processor.com/Editorial/article.asp?article=articles/p2548/31p48.asp&g . . . ,"IBM Extends Silicon With SSDOI", published Nov. 287, 2003, vol. 25, Issue 48.

* cited by examiner

HYBRID ORIENTED SUBSTRATES AND CRYSTAL IMPRINTING METHODS FOR FORMING SUCH HYBRID ORIENTED SUBSTRATES

CROSS-REFERENCE TO RELATED APPLICATIONS

This application is related to application Ser. No. 11/154,907, filed Jun. 16, 2005, and application Ser. No. 11/155,030, filed Jun. 16, 2005, the disclosure of each of which is hereby incorporated by reference herein in its entirety.

FIELD OF THE INVENTION

The invention relates generally to semiconductor substrates and fabrication methods and, more particularly, to hybrid oriented substrates and semiconductor structures and methods for forming such hybrid oriented substrates and semiconductor structures.

BACKGROUND OF THE INVENTION

Devices fabricated using silicon-on-insulator (SOI) substrates provide certain performance improvements, such as lower parasitic junction capacitance, in comparison with comparable devices built directly in a bulk silicon substrate. However, semiconductor manufacturers have recognized that straight scaling of either silicon-on-insulator (SOI) device structures or bulk (e.g., non-SOI) device structures cannot improve integrated circuit performance at a rate sufficient to continue current historical trends. To overcome these performance restrictions imposed by physical scalability limitations, integrated circuit designers are exploring other avenues for enhancing device performance. In particular, structural innovations for making smaller and faster transistor devices that consume less power are being explored as alternatives to straight scaling.

Generally, SOI substrates include a thin active layer of silicon partitioned into discrete electrically-isolated islands or regions (i.e., the SOI regions) into which devices are built and a thin buried layer of an insulator, such as oxide ($SiO_2$), electrically isolating the active layer from the rest of the substrate. Traditional transistor devices, such as metal-oxide semiconductor field effect transistors (MOSFET's), feature source and drain regions formed within the active layer of the SOI substrate and a gate defining a channel region in the active layer disposed between the source and drain regions.

The thickness of the silicon active layer of the SOI substrate determines whether the depletion of the channel region will extend beneath the gate fully to an interface between the active silicon layer and the underlying insulator layer. Partially depleted SOI (PDSOI) transistor devices are formed in an active layer that is thick enough that the channel region under typical gate voltages will not be fully depleted across its full thickness when the device is in operation. The design and operation of partially depleted SOI transistor devices and bulk transistor devices are similar. In contrast, the channel region of fully-depleted SOI (FDSOI) transistor devices extends to the interface between the active silicon layer and the underlying buried oxide layer under typical gate voltages.

Although the operation of SOI transistor devices provide certain performance advantages over the operation of comparable bulk devices, SOI transistor devices suffer from floating body effects related to the device isolation from the fixed potential substrate underlying the buried insulator layer. In bulk transistor devices, the device may be electrically connected through the substrate such that the threshold voltage is stable relative to the drain-to-source voltage. In contrast, the un-depleted silicon beneath the gate (e.g., the body) in PDSOI transistor devices is electrically floating with respect to the substrate because of the intervening insulator layer, which lowers the effective threshold voltage and thereby increases the drain current. Consequently, floating body effects may contribute to undesirable performance shifts in the PDSOI transistor device relative to design and instability of the transistor operating characteristics.

FDSOI transistor devices experience reduced floating body problems in comparison to PDSOI transistor devices because the effective thickness of the body is reduced or eliminated. Consequently, semiconductor manufacturers are seeking techniques for effectively thinning the active layer of SOI substrates to an ultra-thin thickness (i.e., less than or equal to about 20 nanometers (nm) and preferably less than about 10 nm) that provides full depletion of the channel region under typical gate voltages. However, the thickness of these thin active layers must be uniform across the entire substrate because device behavior is sensitive to the thickness. Conventional processes for forming active silicon layers in this thickness range are unable to provide satisfactory thickness uniformity.

Although SOI transistor devices provide certain performance improvements, integrated circuit designs often require devices formed in bulk regions on the same substrate as SOI regions. Hybrid oriented substrates have been developed that include both SOI regions and bulk silicon regions. Despite their benefits, conventional hybrid oriented substrates are deficient in certain aspects that limit device performance. Conventional approaches for forming such hybrid oriented substrates, which rely on oxide-oxide bonding, epitaxy, and polishing, are not amenable to the fabrication of thin SOI regions for building FDSOI transistor devices. Furthermore, these conventional approaches cannot form thin active silicon layers with a tightly controlled thickness across the substrate.

Yet another deficiency of conventional hybrid orientation substrates is that the SOI regions are limited to a single crystal orientation and the bulk regions are limited to a single crystal orientation. This limits the performance of different types of transistor devices formed on such substrates because, for example, carrier mobility is contingent upon crystal orientation. This crystal orientation dependence may limit the performance of one type of device if the performance of a different type of device is optimized.

What is needed, therefore, is a hybrid oriented substrate with bulk regions and SOI regions defined in a silicon active layer, which is preferably ultra-thin, and methods of manufacturing such hybrid oriented substrates that overcome these and other disadvantages of conventional hybrid oriented substrates and conventional methods for forming hybrid oriented substrates.

SUMMARY OF THE INVENTION

In accordance with one aspect of the present invention, a semiconductor structure comprises an insulating layer on a substrate, a plurality of electrically-isolated silicon-on-insulator (SOI) regions separated from the substrate by the insulating layer, and a plurality of electrically-isolated bulk silicon regions extending through the insulating layer to the substrate. The SOI regions are oriented with either a first crystal orientation or a second crystal orientation that differs from the first crystal orientation. The bulk silicon regions are oriented with a third crystal orientation. Preferably, the substrate is also oriented with the third crystal orientation.

In accordance with another aspect of the present invention, a damascene or imprinting method is provided for fabricating a semiconductor structure on a silicon substrate covered by an insulating layer. The method includes forming a plurality of first amorphous silicon features on the insulating layer separated from the substrate by the insulating layer and also forming a plurality of second amorphous silicon features in the insulating layer that extend through the insulating layer to the substrate. A first number of the first amorphous silicon features are crystallized with a first crystal orientation and a second number of the first amorphous silicon features are crystallized with a second crystal orientation that differs from the first crystal orientation. The second amorphous silicon features are crystallized with a third crystal orientation.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1:
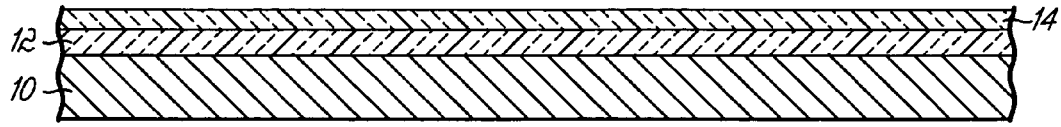
FIGS. 1-11 are diagrammatic cross-sectional views of a portion of a substrate at various stages of a processing method in accordance with an embodiment of the invention.

With reference to FIG. 1, a substrate 10 is covered by an oxide layer 12 of an insulating material, such as silicon dioxide ($SiO_2$), formed utilizing a conventional thermal growth process or by chemical vapor deposition (CVD) or plasma-assisted CVD. The substrate 10, which is preferably a monocrystalline or single crystal bulk silicon wafer, has a pre-selected crystal orientation, such as a <100> crystal orientation or a <110> crystal orientation, or another crystal orientation such as <111>. Typically, the surface normal of the substrate 10 and the crystal orientation of the crystal structure of substrate 10 coincide to within a tolerance for misalignment of about ±0.5°; however, the invention is not so limited. The oxide layer 12 has a substantially uniform thickness in the range of about 10 nanometers (nm) to about 100 nm across the entire surface of the substrate 10.

A hardmask 14 is formed atop oxide layer 12 utilizing a conventional deposition process such as CVD or plasma-assisted CVD. The hardmask 14 may be composed of a material like silicon nitride ($Si_3N_4$) that has a hardness and wear resistance so as to be capable of functioning as a hardmask and a polish stop layer. The material forming hardmask 14 must also etch selectively to the substrate 10 and oxide layer 12. Typically, hardmask 14 has a thickness ranging from less than or equal to about 10 nm to about 100 nm. The thickness of the hardmask 14 determines, or substantially determines (if the hardmask 14 is partially eroded during the fabrication process), the thickness of SOI regions 52, 54 (FIG. 11) subsequently formed by the processing method of the present invention. Preferably, the hardmask 14 has a thickness less than or equal to 20 nm, either initially or following the fabrication stage of FIG. 11, such that the thickness of SOI regions 52, 54 is less than or equal to 20 nm. More preferably, the thickness of the hardmask 14 is less than or equal to 10 nm, either initially or following the fabrication stage of FIG. 11, so that the fabricated SOI regions 52, 54 have a thickness of less than or equal to 10 nm. It is noted that hardmask 14 is used in a subsequent fabrication stage to transfer an imaged pattern representative of bulk silicon regions 56 (FIG. 11) through the oxide layer 12.

Figure 2:
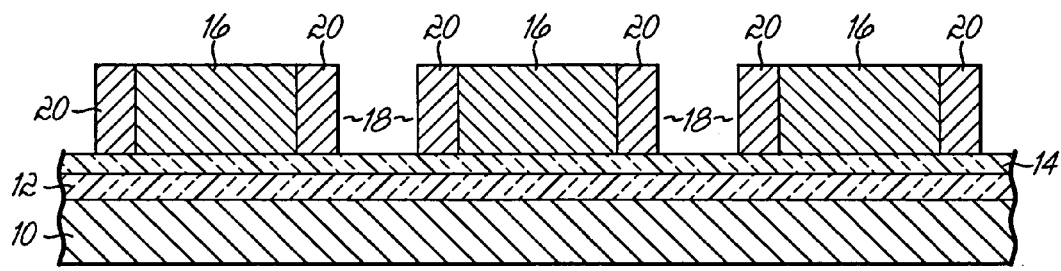
Figure 11:
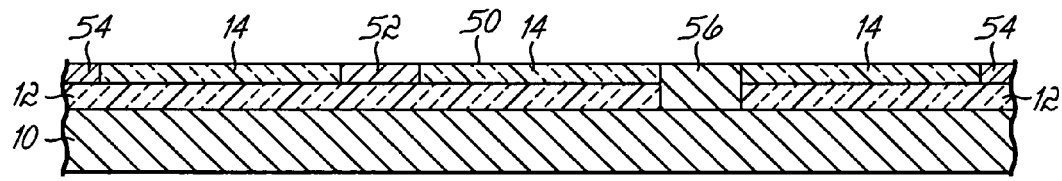

With reference to FIG. 2 in which like reference numerals refer to like features in FIG. 1 and at a subsequent fabrication stage, a patterned sacrificial mask 16 covers the hardmask 14 to define prospective locations for the SOI and bulk regions 52, 54, 56 (FIG. 11). To that end, a blanket layer of the constituent material of sacrificial mask 16 is formed, preferably conformally, on the surface of hardmask 14 and apertures or openings 18 characteristic of a pattern of SOI and bulk regions 52, 54, 56 are formed in this layer using conventional lithography and etching to define the patterned sacrificial mask 16. Specifically, a photoresist (not shown) is applied to an upper horizontal surface of the blanket layer, the photoresist is exposed to a pattern of radiation, the pattern transferred into the exposed photoresist is developed, and then the sacrificial layer is etched using the patterned photoresist as a template to define openings 18. Suitable etching processes include any conventional anisotropic dry etching process, such as reactive-ion etching (RIE) and plasma etching. The chemistry of the etching process, which may be conducted in a single etching step or multiple steps, removes portions of the hardmask 14 visible through openings 18 and stops vertically on the hardmask 14. The openings 18, which may be lines, are imaged by a subsequent processing step into the hardmask 14. The patterned sacrificial mask 16 is composed of any material, such as polysilicon, that can be etched highly selective to the material of oxide layer 12 and the material of hardmask 14.

The openings 18 defined in the patterned sacrificial mask 16 may be formed with a minimum feature size of "1·F", wherein "F" refers to the effective resolution of the system or the minimum lithographic feature dimension that can be resolved in a lithographic exposure. After the openings 18 are formed, the vertical sidewalls are bare. However, optional spacers 20 may be deposited on the vertical sidewalls of patterned sacrificial mask 16 bordering the openings 18, which reduces the minimum feature size defined dimensionally by the boundaries of openings 18 to a sub-minimum width less than 1·F. The horizontal width, d, of each spacer 20 may be precisely determined by the forming process such that the minimum feature size is reduced to an effective dimension of ((1·F)−(2·d)). The optional spacers 20 may be formed, for example, by a process that includes depositing a layer of a material similar or identical to the material of the patterned sacrificial mask 16 and etching the layer using an anisotropic dry etch technique, such as RIE, that removes the overburden leaving behind only the portions on the vertical sidewalls of the patterned sacrificial mask 16. The constituent material of patterned sacrificial mask 16 and the spacers 20 may be, for example, by polysilicon. The optional spacers 20 may be a single spacer, as shown, or may comprise multiple individual spacers. The process forming the spacers 20 may partially erode the thickness of the sacrificial mask 16, which is tolerated because the sacrificial mask 16 is eventually removed during a subsequent process step and is not present in the completed semiconductor structure.

Figure 3:
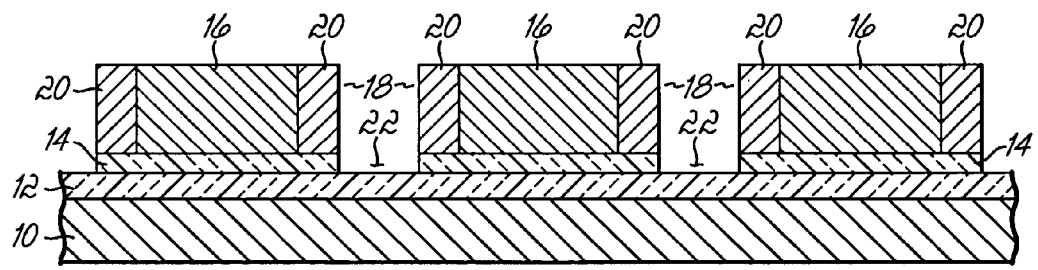

With reference to FIG. 3 in which like reference numerals refer to like features in FIG. 2 and at a subsequent fabrication stage, apertures or openings 22 are formed in hardmask 14 using a conventional anisotropic etching process that stops vertically on the oxide layer 12. Suitable etching processes include any conventional anisotropic dry etching process, such as RIE or plasma etching. The etching process is conducted in a single etching step or multiple steps and comprises an etch chemistry selective to the material of oxide layer 12. The pattern of openings 22 in hardmask 14, which may be lines, represents a transferred image of the openings 18 in sacrificial mask 16. The openings 18 serve as a template for openings 22 and the dimensions of openings 18 are transferred to the dimensions of openings 22. As a result, openings 22 may have a sub-minimum width less than (1·F) if optional spacers 20 are added to the vertical sidewall bounding each of the openings 18.

Figure 4:
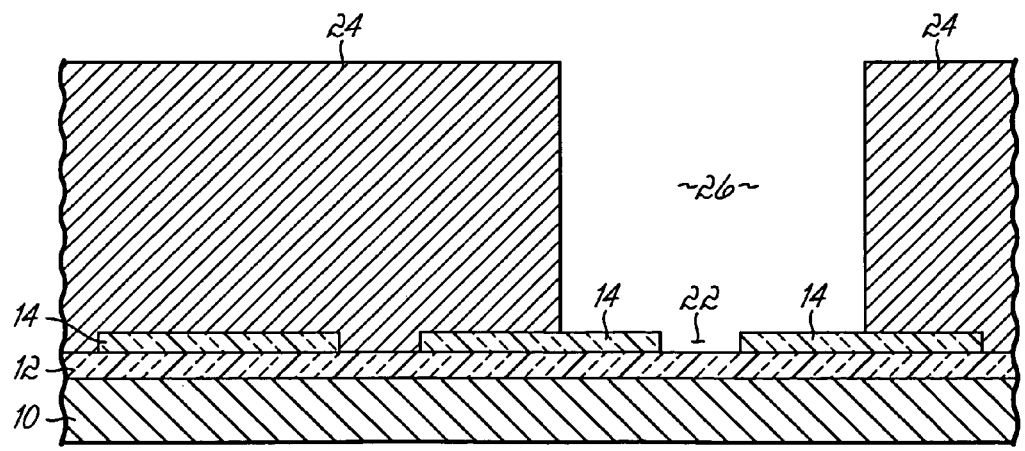

With reference to FIG. 4 in which like reference numerals refer to like features in FIG. 3 and at a subsequent fabrication stage, the sacrificial mask 16 is removed by an etch process, such as a wet etch process using an aqueous mixture of nitric acid ($HNO_3$) and hydrofluoric acid (HF), that etches the sacrificial mask 16 selective to the material of the patterned hardmask 14 and the oxide layer 12. After sacrificial mask 16 is removed, a patterned photoresist 24 is applied to the surface exposed as part of a conventional lithography and etching process. The lithography step of the process may include applying a layer of undeveloped photoresist to the upper horizontal surface of the patterned hardmask 14, exposing the photoresist 24 to an imaged pattern of radiation, and developing the pattern into the exposed photoresist 24. Openings 26, which are defined by the lithography process in the patterned photoresist 24, coincide with a fraction of the openings 22. These registered openings 22, 26 expose the oxide layer 12 across unprotected regions intended for the subsequent formation of bulk silicon regions 56 (FIG. 11). Regions of the patterned photoresist 24 mask another fraction of the openings 22 to protect these covered areas of the oxide layer 12, which are later incorporated into SOI regions 52, 54 (FIG. 11) in the finished semiconductor structure, from the subsequent etching process.

Figure 5:
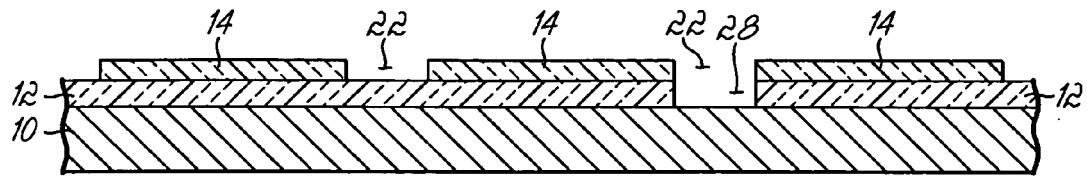
Figure 6:
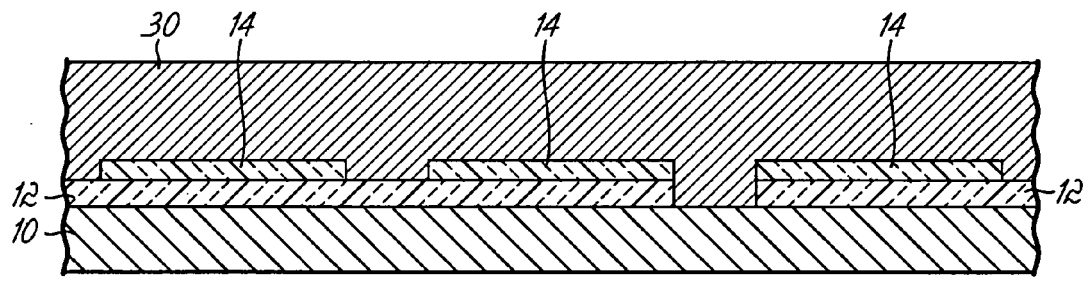

With reference to FIG. 5 in which like reference numerals refer to like features in FIG. 6 and at a subsequent fabrication stage, the etching step of the conventional lithography and etching process forms apertures or openings 28 in oxide layer 12 by removing the oxide exposed by the registration of openings 22 with the openings 26 in the patterned photoresist 24. These registered openings 22, 28 define the boundaries of future bulk silicon regions 56. The etching step, which may be conducted in one step or multiple etching steps, stops vertically on the substrate 10 and may include the use of a dry etching process such as RIE, plasma etching or ion beam etching. The openings 28, each of which coincides with one of the openings 22, opened into the structure are subsequently filled with amorphous silicon or silicon in a form otherwise suitable for recrystallization. The photoresist 24 is removed from the structure utilizing a conventional stripping process as known and used in the art, such as resist stripping, wet cleaning, and the like, after the pattern of openings 28 is transferred into oxide layer 12.

With reference to FIG. 6 in which like reference numerals refer to like features in FIG. 5 and at a subsequent fabrication stage, a layer of amorphous silicon 30 is then formed, preferably conformally, on all exposed horizontal and vertical surfaces of the structure shown in FIG. 5. The amorphous silicon layer 30 may be formed utilizing a conventional deposition process including, for example, CVD or plasma-enhanced (PE) CVD. In one exemplary embodiment of the present invention, a PECVD deposition process is used in which silane is introduced downstream from a hydrogen plasma region, and the silane to hydrogen ratio, RF power, substrate temperature (typically less than 500° C.), and process pressure are adjusted such that amorphous silicon is deposited instead of polycrystalline. The amorphous silicon layer 30 fills the openings 22 defined in the hardmask 14 and the openings 28 defined in the oxide layer 12 that are registered with certain openings 22. The invention contemplates that the material in layer 30 may be silicon in any crystalline form suitable for recrystallization in accordance with the present invention. The constituent atoms of amorphous silicon may be arranged randomly to completely lack crystalline structure or may exhibit partial crystallinity with localized regions of long range order.

Figure 7:
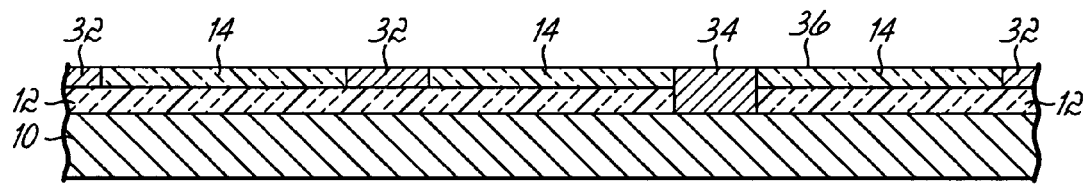

With reference to FIG. 7 in which like reference numerals refer to like features in FIG. 6 and at a subsequent fabrication stage, the upper horizontal surface of amorphous silicon layer 30 is made substantially coplanar with the upper horizontal surface of hardmask 14, preferably by a chemical mechanical polishing (CMP) process, to define a substantially planar exposed surface 36. The resultant planarized structure includes individual plugs or features 32 of amorphous silicon inside non-registered openings 22 that extend vertically to the horizontal level of the oxide layer 12 and individual plugs or features 34 of amorphous silicon residing inside the registered openings 22, 28 that extend vertically to the horizontal level of the substrate 10. The CMP process combines abrasion and dissolution to remove the overburden of excess amorphous silicon in layer 30 and stops on the hardmask 14 so that the only residual amorphous silicon from layer 30 resides in features 32 after planarization. Adjacent amorphous silicon features 32, 34 are separated by and coplanar with intervening regions of hardmask 14.

Figure 8:
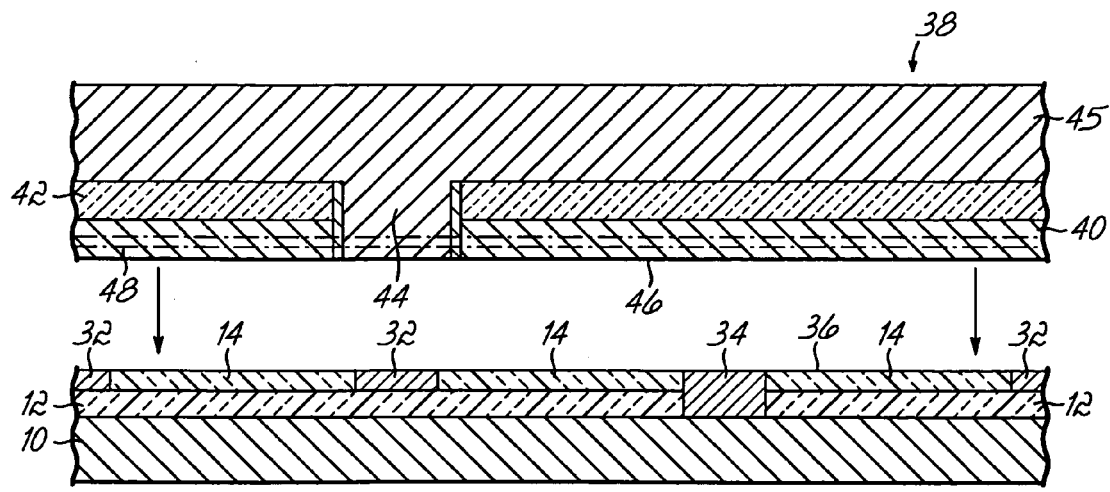

With reference to FIG. 8 in which like reference numerals refer to like features in FIG. 7 and at a subsequent fabrication stage, a seed wafer 38 is provided that carries an SOI layer 40 of silicon, a buried oxide layer 42 separating the SOI layer 40 from seed wafer 38, and bulk silicon regions 44 distributed within the SOI layer 40. The SOI layer 40 has a pre-selected crystal orientation, such as <100>, <110>, or <111>. Each of the bulk silicon regions 44 has a pre-selected crystal orientation (e.g., <100>, <110>, or <111>) that differs from the pre-selected crystal orientation of the SOI layer 40. The bulk silicon regions 44 extend vertically to a substrate 45 of the seed wafer 38, which has an identical crystal orientation. The bulk silicon regions 44 may be formed by known methods of hybrid crystal orientation familiar to persons of ordinary skill in the art. An exposed surface 46 of the SOI layer 40 and bulk silicon regions 44 is preferably optically smooth. In one embodiment of the present invention, the SOI layer 40 has a <100> crystal orientation and the bulk silicon regions 44 each have a <110> crystal orientation. Substrates suitable for use as seed wafer 38 are disclosed, for example, in M Yang et al., "On the Integration of CMOS with Hybrid Crystal Orientations," pp. 18.7.1-0.4, IEEE VLSI Tech. Symp. (2004), and in M. Yang, "High-Performance CMOS Fabricated on Hybrid Substrate with Different Crystal Orientations," pp. 160-61, IEEE IEDM (2004), the disclosure of each of which is hereby incorporated by reference herein in its entirety.

The seed wafer 38 is ion implanted, before being contacted and bonded with substrate 10, using a conventional ion implantation process with hydrogen ions, or other rare gas ions, of relatively low energy to create a shallow and narrow damaged region or band 48. Typically, the depth of the stressed damaged band 48 is about 50 nm to about 200 nm vertically beneath the exposed surface 46. The hydrogen or other rare gas ions will reside predominantly across the damaged band 48 in a profile with a varying concentration as a function of depth below surface 46 and at a depth beneath surface 46 roughly centered about the average penetration depth of the ions. This damaged band 48, after an appropriate thermal treatment, defines a cleaving plane that permits subsequent separation of a thin upper layer generally between band 48 and exposed surface 46. Exemplary processes for forming the damaged band 48 and the subsequent cleaving along the damaged band 48 include the Smart Cut™ process recognized by a person of ordinary skill in the art as a conventional technique used to fabricate bonded SOI substrates, and the process described in U.S. Pat. Nos. 5,374,564 and 5,882,987, the disclosure of each of which is hereby incorporated by reference herein in its entirety.

The exposed surface 46 on the seed wafer 38 is manipulated into a confronting relationship with the planarized exposed surface 36 on substrate 10 with amorphous silicon features 32, 34. The substrate 10 and seed wafer 38 are aligned relative to each other such that the bulk silicon regions 44 are registered spatially with a fraction of the amorphous silicon features 32. After alignment, the remaining amorphous silicon features 32 and amorphous silicon features 34 confront the crystalline silicon in the SOI layer 40. Techniques for achieving alignment of substrates, such as substrate 10 and seed wafer 38, are known to persons of ordinary skill in the art. For example, one conventional alignment technique includes an equipment arrangement having an upper illumination source (e.g., a laser) with viewing optics and a lower illumination source also with viewing optics. After mutually aligning the beams from the two illumination sources, substrate 10 is positioned between the two illumination sources with the exposed surface 36 oriented such that the downward-directed beam from the upper source is aligned with an alignment mark, such as one of the amorphous silicon features 32, 34. Substrate 10 is temporarily removed and the alignment procedure is repeated for seed wafer 38 using another alignment mark, such as one of the bulk silicon regions 44. After seed wafer 38 is aligned, substrate 10 is returned to its original aligned position.

Figure 9:
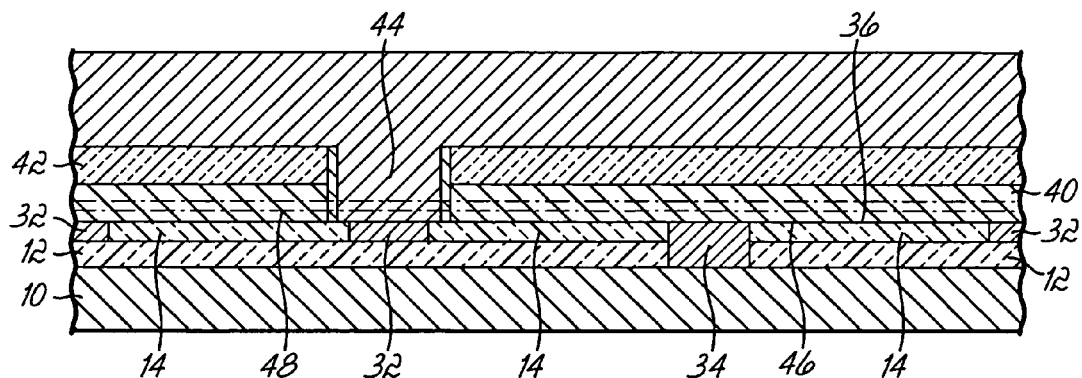

With reference to FIG. 9 in which like reference numerals refer to like features in FIG. 8 and at a subsequent fabrication stage, the exposed surfaces 36, 46 are contacted such that the bulk silicon regions 44 in the SOI layer 40 on seed wafer 38 are in intimate contact with a fraction of the amorphous silicon features 32 on substrate 10. The remaining amorphous silicon features 32 and amorphous silicon features 34 are in intimate contact with the crystalline silicon in the SOI layer 40. The intimate contact, which is typically established at ambient or room temperature, is of a quality sufficient to permit bonding and crystalline growth, as detailed below.

The contacting exposed surfaces 36, 46 are bonded together by a conventional bonding process that exposes the contacting surfaces 36, 46 to conditions that are capable of increasing their mutual bonding energy. A typical conventional bonding process involves a low temperature thermal treatment or anneal at a sufficient temperature and for a sufficient duration to cause bonding. However, the temperature of the thermal anneal is limited so as to not cause premature separation to occur along the damaged band 48. For example, one appropriate bonding process includes a thermal anneal conducted at a temperature within the range of about 400° C. to about 500° C. and for a duration sufficient to precipitate surface-to-surface bonding between contacting surfaces 36, 46. Optionally, the substrate 10 and seed wafer 38 may be clamped together during the thermal anneal by an external force applying a pressure typically between about 2 kg/cm² and about 2.5 kg/cm². The thermal anneal, which may be performed in the presence or absence of an external force, is also typically performed in a controlled atmosphere consisting of an inert gas, such as $N_2$.

This initial low temperature thermal anneal may also at least partially regrow or crystallize the amorphous silicon in features 32, 34, such that their respective crystal orientation in the partially crystallized form selectively aligns with the adjacent crystalline structures of the contacting single crystal material used to set a pattern for the crystallization of features 32, 34 in which this pattern is reproduced. The crystalline silicon constituting the first crystal orientation in the SOI layer 40 and the constituent crystalline silicon of the second crystal orientation in the bulk silicon regions 44 operate as seeds for crystalline growth of the contacting amorphous silicon features 32, 34. Similarly, the substrate 10 serves as another seed for crystalline growth of amorphous silicon features 34. Specifically, amorphous silicon features 32 in contact with the bulk silicon regions 44 in the SOI layer 40 at least partially crystallize in a crystal structure having the crystal orientation of the bulk silicon regions 44. The remaining amorphous silicon features 32 at least partially crystallize in a crystal structure having the crystal orientation of the SOI layer 40. Amorphous silicon features 34 at least partially crystallize in a crystal structure having the common or shared crystal orientation of the substrate 10 and SOI layer 40.

Preferably, the thickness of amorphous silicon features 32, 34 is selected such that the crystallization, when complete, occurs relatively uniformly across their respective depths. Amorphous silicon features 34, which are thicker than amorphous silicon features 32, are crystallized from both the top and bottom due to the interfaces with both substrate 10 and SOI layer 40, which helps to ensure crystallization across their entire thickness. Generally, the volume or thickness of crystalline material in contact with each of the amorphous silicon features 32, 34 is greater than the volume or thickness of the corresponding feature 32, 34. In other words, the contacting crystalline material drives the crystallization of the amorphous silicon features 32, 34 during thermal treatment.

Figure 10:
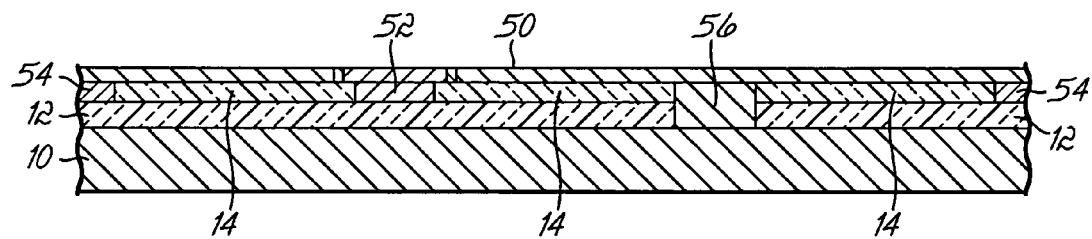

With reference to FIG. 10 in which like reference numerals refer to like features in FIG. 9 and at a subsequent fabrication stage, the bonded substrate 10 and seed wafer 38 are thermally treated in an inert atmosphere and at a temperature greater than the temperature of the preceding thermal treatment (FIG. 9) that causes bonding. Preferably, the thermal treatment or anneal is at a temperature in the range of about 700° C. to about 1100° C. and for a duration sufficient to cause the hydrogen, or other rare gas, in the damaged band 48 to coalesce into microscopic bubbles localized within the damaged band 48. The formation of gas bubbles in the damaged band 48 causes the SOI layer 40 and bulk silicon regions 44 to separate along a cleaving plane defined by the damaged band 48. A new exposed surface 50 results after separation along the cleaving plane. Portions of the residual SOI layer 40 and bulk silicon regions 44 between the exposed surface 46 (FIG. 9) and the damaged band 48 remain bonded to the surface 36 of substrate 10. However, due to a subsequent planarization step in FIG. 11, the residual SOI layer 40 and bulk silicon regions 44 are removed after conversion of the amorphous silicon features 32, 34 to crystalline structures. This transfer technique that provides the template for regrowth of amorphous silicon features 32, 34 also reduces the residual thickness of the seed wafer 38 that is removed in a subsequent fabrication stage.

This high-temperature thermal treatment may complete the crystallization of any amorphous silicon features 32, 34 (FIG. 9) remaining after the previous low-temperature thermal anneal. Specifically, amorphous silicon features 32 (FIG. 9) previously in contact with the bulk silicon regions 44 in the SOI layer 40 crystallize as active silicon regions or SOI regions 52 and have the crystal orientation of the bulk silicon regions 44 on seed wafer 38. The remaining amorphous silicon features 32 (FIG. 9) previously in contact with the SOI layer 40 crystallize as active silicon regions or SOI regions 54 and possess the crystal orientation of the SOI layer 40. Consequently, the SOI regions 52, 54 will have different crystal orientations because the SOI layer 40 and bulk silicon regions 44 have different crystal orientations. Amorphous silicon features 34 (FIG. 9), which contact or have an interface with the SOI layer 40 on one end and have an interface with the substrate 10 on the opposite end crystallize as bulk silicon regions 56 that have the common crystal orientation of the substrate 10 and SOI layer 40. Crystallization occurs across the thickness of the amorphous silicon features 32, 34. The high temperature thermal anneal will also increase the bond strength across the interface between the contacting surfaces 36, 46.

With reference to FIG. 11 in which like reference numerals refer to like features in FIG. 10 and at a subsequent fabrication stage, the exposed surface 50 is made substantially coplanar with the upper horizontal surface of hardmask 14, preferably by a CMP process. The CMP process combines abrasion and dissolution to remove the overburden of the residual SOI layer 40 and bulk silicon regions 44. In the completed structure, adjacent SOI regions 52, SOI regions 54, and bulk silicon regions 56 are separated and electrically isolated by intervening regions of oxide layer 12 and hardmask 14. The completed structure contains SOI regions 52 of one crystal orientation, SOI regions 54 of a different crystal orientation than SOI regions 52, and bulk silicon regions 56 having the same crystal orientation as SOI regions 54. The upper horizontal surfaces of the regions 52, 54, 56 are substantially coplanar and the SOI regions 52, 54 have substantially the same thickness. Preferably, each of the crystal orientations is substantially equal to one of the <100>, <110>, or <111> principle axes of a diamond lattice structure, which is characteristic of silicon.

The thickness of the SOI regions 52, 54 is determined by the thickness of the hardmask layer 14, which is highly uniform in thickness due to the ability to precisely control thickness uniformity in deposition processes as recognized by a person of ordinary skill in the art. As a result, the thickness of the SOI regions 52, 54 is approximately equal to the initial thickness of the hardmask layer 14, which ranges from about 10 nm to about 100 nm. Preferably, the SOI regions 52, 54 have a thickness in the ultra-thin (i.e., less than or equal to 20 nm) regime suitable to manufacture fully-depleted SOI devices (FDSOI), although the invention is not so limited. More preferably, the fabricated SOI regions 52, 54 have a thickness of less than or equal to 10 nm, which is more beneficial for FDSOI. Due to the planarization during processing (FIGS. 7, 11), the SOI regions 52, 54 may be thinned to a thickness less than the initial thickness of the hardmask layer 14 and, in particular, may be thinned to a thickness less than or equal to 20 nm or as thin as less than or equal to 10 nm.

The SOI regions 52, 54 are located on an insulator (i.e., oxide layer 12) defining a buried oxide (BOX) layer, which is characteristic of an SOI wafer, with a thickness equal to the thickness of the oxide layer 12 (i.e., about 10 nm to about 100 nm). A person of ordinary skill in the art appreciates that numerous SOI regions 52, 54 and bulk silicon regions 56 are distributed across the exposed surface 50 of substrate 10, typically in a pattern of repeating groups amenable to the replication of an identical set of active devices in each group in the pattern.

After the fabrication stage of FIG. 11 is completed, substrate 10 is ready for subsequent process steps, such as the formation of semiconductor devices, interlevel insulators, and wiring in the interlevel insulators, to form an integrated circuit. In accordance with the present invention, SOI regions 52 and SOI regions 54 may include different types of semiconductor devices appropriate for such SOI regions and bulk silicon regions 56 may further include semiconductor devices, preferably, more appropriately built in bulk regions. Generally, any type of field effect transistor (FET), such as, for example, N-channel metal oxide semiconductor (MOS) FET's, P-channel MOS FET's, complimentary metal oxide semiconductor (CMOS) FET's, bipolar transistors such as lateral bipolar transistors, and the like may be built in the SOI regions 52, 54 and bulk regions 56. Persons of ordinary skill in the art comprehend conventional FET structures that may be fabricated in the SOI regions 52, 54 and bulk regions 56 and the standard processing steps applied to form those conventional structures.

As a specific example of one advantage of the present invention, the SOI regions 52, 54 may further include N-channel MOSFET's and P-channel MOSFET's, in which each specific type of device is built on a corresponding one of the two types of SOI regions 52, 54 with a crystal orientation that optimizes device performance. Even more specifically, SOI regions 52 may have a <100> crystal orientation that optimizes or enhances carrier mobility (i.e., device performance) for N-channel MOSFET's in comparison with other orientations and SOI regions 54 may have a <110> crystal orientation that optimizes or enhances carrier mobility for p-channel MOSFET's in comparison with other orientations. Consequently, all or a large fraction of the SOI regions 52 may further include an N-channel MOSFET (not shown) and all or a large fraction of SOI regions 54 may further include a P-channel MOSFET (not shown). Because the SOI regions 52, 54 with the differing crystal orientations are located on an insulator (i.e., oxide layer 12), the devices formed thereon will be n-channel and p-channel SOI-MOSFET's that may be operated with full depletion if the thickness of the SOI regions 52, 54 is appropriate.

Generally, the present invention is directed to a structure and method of manufacture for a hybrid oriented substrate that includes a plurality of coplanar SOI regions 52, 54, each of which has one of two different crystal orientations, and bulk regions 56 each of which has a single crystal orientation. Each of the coplanar SOI regions 52, 54 and bulk regions 56 is electrically isolated from all other regions 52, 54, 56 by insulating material from oxide layer 12 and patterned hardmask 14. The method of manufacture relies on a damascene or crystal imprinting technique, which allows the formation of ultra-thin SOI regions 52, 54 with tight thickness control and also allows the formation of bulk regions 56 on the same substrate 10. A two-sided imprinting method is preferably used for the formation of the bulk regions 56. The coplanarity of the regions 52, 54, 56 reduces depth of focus concerns experienced with conventional substrates of poor planarity. Preferably, the SOI regions 52, 54 are ultra-thin with a thickness less than or equal to 20 nm and, most preferably, less than or equal to 10 nm.

The present invention represents a significant advancement over conventional hybrid orientation substrates that are limited to standard thickness SOI regions and that are not amenable to the fabrication of ultra-thin SOI regions. Furthermore, the present invention is not limited to a single crystal orientation for the SOI regions and a single crystal orientation for the bulk regions, as are conventional hybrid orientation substrates. Consequently, the present invention assists in overcoming the physical scalability limitations of CMOS technologies.

Figure 12:
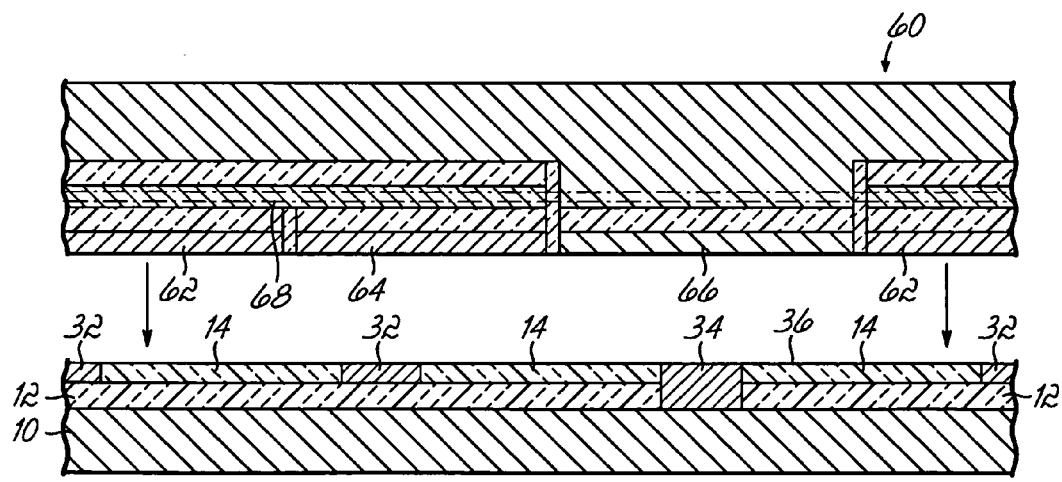
FIG. 12 is a diagrammatic cross-sectional view similar to FIG. 8 of a portion of a substrate at an initial processing stage in accordance with an alternative embodiment of the invention.

With reference to FIG. 12 in which like reference numerals refer to like features in FIG. 8 and in accordance with an alternative embodiment of the invention, a seed wafer 60 may be substituted for seed wafer 38 (FIG. 8) at a juncture in the processing method after the fabrication stages of FIGS. 1-7. Seed wafer 60 includes a plurality of individual seed regions 62, 64, 66 each having a crystal structure of a different crystal orientation and a damaged band 68 similar to damaged band 48 (FIG. 8). The seed regions 62, 64, 66 are arranged across the surface of seed wafer 60 in a repeatable pattern. The seed wafer 60 is aligned, contacted, and bonded with substrate 10, as described above with regard to the fabrication stages for bonding seed wafer 38 with substrate 10 in FIGS. 8-10. After bonding, seed regions 62 contact or share an interface with a portion of the amorphous silicon features 32, seed regions 64 contact or share an interface with another portion of the amorphous silicon features 32, and seed regions 66 contact or share an interface with amorphous silicon features 34. Seed regions 66 have the same crystal orientation as substrate 10.

During thermal treatments, which may be equivalent to those described above with regard to FIG. 9, amorphous silicon features 32 in contact with seed regions 62, 64 will crystallize with the corresponding crystal orientation of the respective seed regions 62, 64. Similarly, amorphous silicon features 34 in contact with seed regions 66 will crystallize with the corresponding crystal orientation of seed regions 66. Processing then continues substantially as described above in FIGS. 9-11 to form SOI regions (not shown but similar to SOI regions 52, 54) each having a corresponding one of two possible different crystal orientations and bulk silicon regions (not shown but similar to bulk silicon regions 56) each of a crystal orientation that differs from the crystal orientations of the SOI regions but has the same crystal orientation as substrate 10. A person of ordinary skill in the art will recognize that SOI regions having an arbitrary plurality of different crystal orientations may be fabricated consistent with the present invention with a suitable seed wafer to provide the differently oriented seeds for crystallization.

References herein to terms such as "vertical", "horizontal", etc. are made by way of example, and not by way of limitation, to establish a frame of reference. The term "horizontal" as used herein is defined as a plane parallel to the conventional plane or surface of substrate 10, regardless of the actual spatial orientation of substrate 10. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the present invention.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A semiconductor structure comprising:
    a silicon substrate;
    an insulating layer on said substrate;
    a plurality of electrically-isolated silicon-on-insulator (SOI) regions separated from said substrate by said insulating layer, a first number of said SOI regions having a first crystal orientation, a second number of said SOI regions having a second crystal orientation that differs from said first crystal orientation, and said SOI regions having a thickness of less than or equal to 20 nm; and
    a plurality of electrically-isolated bulk silicon regions extending through said insulating layer to said substrate, each of said bulk silicon regions having a third crystal orientation that differs from the first and second crystal orientations.

2. The semiconductor structure of claim 1 wherein said SOI regions have a thickness of less than or equal to 10 nm.

3. The semiconductor structure of claim 1 wherein said first crystal orientation is a <100> crystal orientation and said first number of said SOI regions each include an N-channel MOSFET semiconductor device.

4. The semiconductor structure of claim 3 wherein said second crystal orientation is a <110> crystal orientation and said second number of said SOI regions each include a P-channel MOSFET semiconductor device.

5. The semiconductor structure of claim 1 wherein said second crystal orientation is a <110> crystal orientation and said second number of said SOI regions each include a P-channel MOSFET semiconductor device.

6. The semiconductor structure of claim 1 further comprising:
    a plurality of isolation regions, each of said isolation regions arranged laterally between one of said bulk silicon regions and an adjacent one of said SOI regions.

7. The semiconductor structure of claim 1 wherein said substrate is single crystal silicon having said third crystal orientation.

8. The semiconductor structure of claim 1 wherein said first crystal orientation, said second crystal orientation, and said third crystal orientation are selected from the group consisting of <100>, <110>, and <111>.

9. A semiconductor structure comprising:
    a silicon substrate;
    an insulating layer in contact with said substrate;
    a plurality of electrically-isolated silicon-on-insulator (SOI) regions separated from said substrate by said insulating layer, a first number of said SOI regions having a first crystal orientation, and a second number of said SOI regions having a second crystal orientation that differs from said first crystal orientation; and
    a plurality of electrically-isolated bulk silicon regions extending through said insulating layer to intersect with said substrate, each of said bulk silicon regions having a third crystal orientation that differs from the first and second crystal orientations;
    wherein said SOI regions have a width dimension that is less than a minimum lithographic feature dimension (F) achievable by lithography.

10. The semiconductor structure of claim 9 wherein said first crystal orientation is a <100> crystal orientation and said first number of said SOI regions each include an N-channel MOSFET semiconductor device.

11. The semiconductor structure of claim 10 wherein said second crystal orientation is a <110> crystal orientation and said second number of said SOI regions each include a P-channel MOSFET semiconductor device.

12. The semiconductor structure of claim 9 wherein said second crystal orientation is a <110> crystal orientation and said second number of said SOI regions each include a P-channel MOSFET semiconductor device.

13. The semiconductor structure of claim 9 further comprising:
a plurality of isolation regions, each of said isolation regions arranged laterally between one of said bulk silicon regions and an adjacent one of said SOI regions.

14. The semiconductor structure of claim 9 wherein said substrate is single crystal silicon having said third crystal orientation.

15. The semiconductor structure of claim 9 wherein said first crystal orientation, said second crystal orientation, and said third crystal orientation are selected from the group consisting of <100>, <110>, and <111>.

* * * * *